United States Patent [19]

Kitahara et al.

[11] Patent Number: 4,985,745
[45] Date of Patent: Jan. 15, 1991

[54] SUBSTRATE STRUCTURE FOR COMPOSITE SEMICONDUCTOR DEVICE

[75] Inventors: Koichi Kitahara, Kawasaki; Yoshinori Natsume, Hyogo; Yoshinori Hosoki, Kawasaki, all of Japan

[73] Assignee: Kabushiki Kaisha Toshiba, Kawasaki, Japan

[21] Appl. No.: 293,026

[22] Filed: Jan. 3, 1989

[30] Foreign Application Priority Data

Jan. 5, 1988 [JP] Japan .................................. 63-465

[51] Int. Cl.$^5$ ...................... H01L 21/20; H01L 21/76; H01L 21/38
[52] U.S. Cl. ........................................ 357/49; 357/48; 357/55; 437/62
[58] Field of Search ...................................... 357/49, 55

[56] References Cited

U.S. PATENT DOCUMENTS

| | | | |
|---|---|---|---|
| 4,261,003 | 4/1981 | Magdo et al. | 357/49 |
| 4,283,235 | 8/1981 | Raffel et al. | 357/49 |
| 4,408,386 | 10/1983 | Takayashiki et al. | 357/49 |
| 4,494,303 | 1/1985 | Celler et al. | 357/49 |
| 4,501,060 | 2/1985 | Frye et al. | 357/49 |
| 4,523,370 | 6/1985 | Sullivan et al. | 437/46 |
| 4,601,779 | 7/1986 | Abernathey et al. | 156/628 |
| 4,624,047 | 11/1986 | Tani | 357/49 |
| 4,638,552 | 1/1987 | Shinbo et al. | 357/49 |
| 4,661,832 | 4/1987 | Lechaton et al. | 357/49 |
| 4,710,794 | 12/1987 | Koshino et al. | 357/49 |
| 4,784,970 | 11/1988 | Solomon | 437/62 |

FOREIGN PATENT DOCUMENTS

| | | | |
|---|---|---|---|
| 0147626 | 7/1985 | European Pat. Off. | |
| 0217288 | 4/1987 | European Pat. Off. | 357/49 |
| 0034483 | 3/1978 | Japan | 357/49 |
| 57-133637 | 8/1982 | Japan | 357/49 |
| 62-76645 | 4/1987 | Japan | 357/49 |
| 62-177938 | 8/1987 | Japan | 357/49 |

OTHER PUBLICATIONS

Lambotkar, "High performance transistor structure," IBM TDB, vol. 27, No. 7B, Dec./84, pp. 4517-4520.
K. G. Ashar, "Insulating layer pedestal transistor," IBM TDB, vol. 14, No. 5, Oct. 71, p. 1595.
Spencer et al., "Gas mixture control permits nonselective reactive ion etching," vol. 21, No. 4, 9/78, pp. 1518-1519.
Kemlage et al., "Dielectric Isolation," IBM TDB, vol. 16, No. 9, Feb./74, pp. 2869-2870.
U.S. Pat. Appln. Ser. No. 06/911,895 filed Sep. 26, 1986.
U.S. Pat. Appln. Ser. No. 07/215,381 filed Jul. 5, 1988.
Ohata et al., "Dielectrically Isolated Intelligent Power Switch," IEEE 1987 Custom Integrated Circuits Conference, Jul. 1987, pp. 443-446.

Primary Examiner—Andrew J. James
Assistant Examiner—Viet Q. Nguyen
Attorney, Agent, or Firm—Finnegan, Henderson, Farabow, Garrett, and Dunner

[57] ABSTRACT

The main surface of a first semiconductor substrate is bonded to the main surface of a second semiconductor substrate with an insulation film interposed therebetween to form a composite substrate. The first semiconductor substrate and insulation film are selectively etched to form an etched portion which reaches at least the second semiconductor substrate. An impurity layer with an impurity concentration different from that of the first semiconductor substrate is formed on or in the surface area exposed to the etched portion of the first and second semiconductor substrates. An epitaxial layer having an impurity concentration different from that of the impurity layer is formed in the etched portion. The first semiconductor substrate, impurity layer and epitaxial layer are planarized. The first semiconductor substrate, impurity layer and epitaxial layer are etched to make a pattern of the impurity layer on the surface of the composite substrate and the composite semiconductor substrate is aligned for formation of elements based on the pattern. The elements are formed in the composite substrate thus aligned.

8 Claims, 7 Drawing Sheets

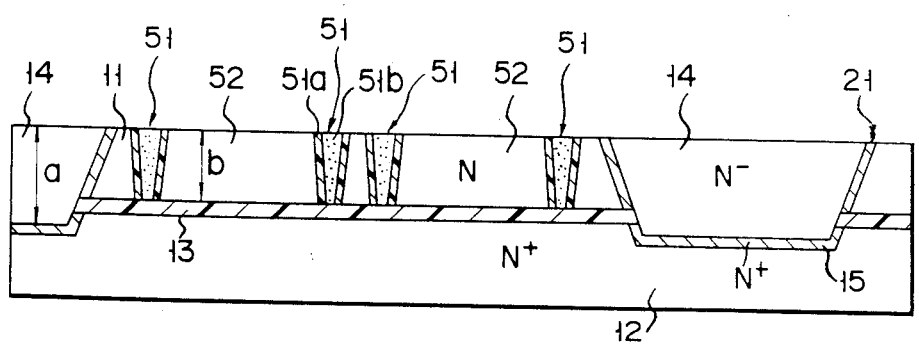
F I G. 4
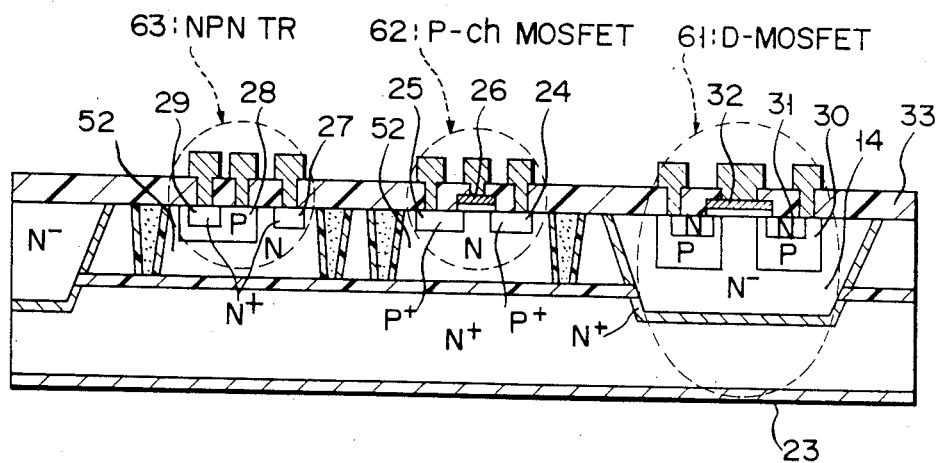
F I G. 5

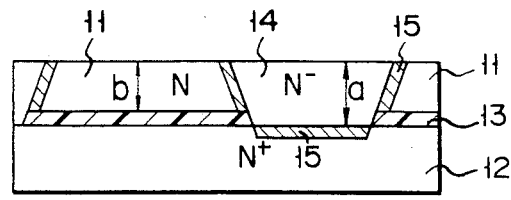
F I G. 6A
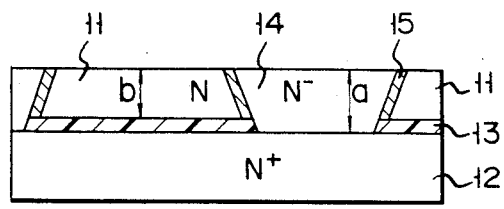
F I G. 6B
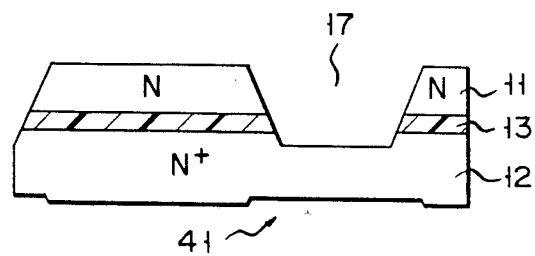
F I G. 7A
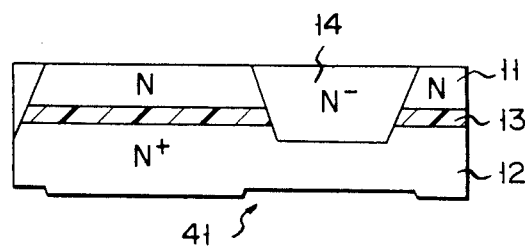
F I G. 7B

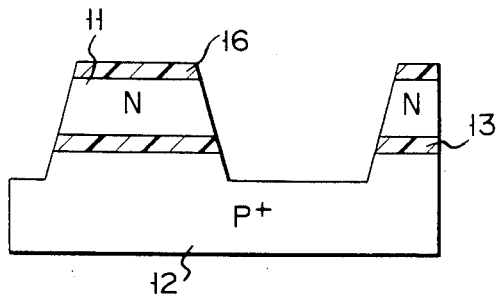
F I G. 8A
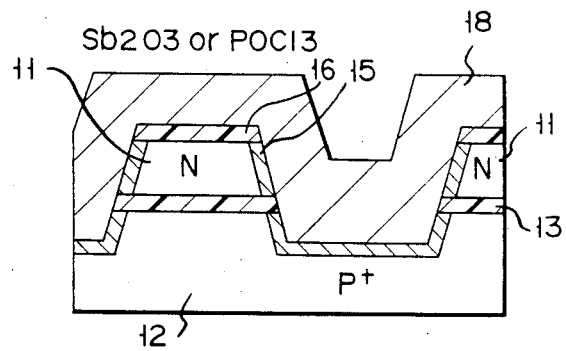
F I G. 8B
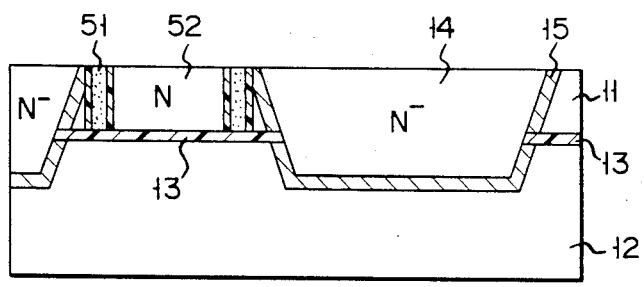
F I G. 8C

SUBSTRATE STRUCTURE FOR COMPOSITE SEMICONDUCTOR DEVICE

BACKGROUND OF THE INVENTION

1. Field of the Invention

This invention relates to a substrate structure for a composite semiconductor device suitable for the formation of a plurality of functional elements which require element isolation.

2. Description of the Related Art

In a composite semiconductor device having a plurality of active elements or passive elements integrated on a single substrate it is necessary to electrically isolate such elements from other elements. An isolation method for this purpose includes, for example, a method utilizing a reverse-biased PN junction, or a method utilizing an insulating material.

A semiconductor substrate having areas separated by a PN junction will be explained below by way of example.

An N type epitaxial layer is deposited on a P type semiconductor substrate, and P+ type impurity is diffused into an epitaxial layer to form an element isolation area reaching the semiconductor substrate. In this way an island-like element area is obtained which is surrounded by the PN junction. The element area is electrically isolated from other epitaxial layer portions by a depletion layer when a reverse bias is applied to the PN junction. This system offers an advantage of being lower in cost. When, on the other hand, a P+ type element isolation area is formed, diffusion unavoidably occurs in a lateral direction to an extent substantially equal to that to which it occurs in a depth direction, causing an increase in element isolation area. In the PN junction isolation a reverse bias is used in which case, since the P+ type element isolation area is usually grounded, an N type layer in the element area adjacent to the isolation layer needs to be held normally at a positive potential. Thus a bias circuit in an integral circuit which is formed within the element area is restricted. Where, for example, transistors of different conductivity types are to be formed, it will be necessary to provide a very complex bias circuit. Furthermore, in the PN junction isolation a parasitic element is usually liable to be formed. Where a transistor is formed, for example, with emitter and base layers formed in the element area and with a semiconductor substrate as a collector, a parasitic transistor can be formed due to the presence of the emitter layer, base layer and P+ type element isolation area.

The element isolation method using an insulating layer will be explained below with respect to FIG. 1.

In a plurality of N type semiconductor element areas, island-like areas are formed which are separated by oxide silicon film 2 and polysilicon layer 3. This method obviates the necessity of providing a reverse bias circuit which is required in the PN junction separation. Furthermore, a restriction caused by the parasitic element can be alleviated. However, since in this system, the substrate is formed of a polysilicon, a thicker substrate is needed, which presents an economical disadvantage. It is also noted that, in a completed device, the back surface or reverse surface of the substrate cannot be used as a current passage because the lower portion, including the reverse surface of the substrate, is insulated.

In order to solve the above problem, there has been proposed a substrate structure for a composite semiconductor device in European Patent Specification (Publication No. 0 217 288; Application No. 86113185.2, Date of filing, 25, 09, 1986). A corresponding U.S. patent application was filed on 26, 09, 1986 and the application number thereof is 911,895. With the substrate structure disclosed in the European Patent Specification, it is possible to form an integrated circuit having a large current capacity and high withstanding voltage and form an electrode on the back or reverse surface of the semiconductor substrate.

However, when the substrate structure disclosed in the European Patent Specification is used, it is difficult to determine the location of an insulation film embedded in the substrate by the external appearance thereof after the substrate is completed. As a result, it becomes difficult to align the substrate structure when active elements are formed in the substrate structure.

SUMMARY OF THE INVENTION

An object of this invention is to provide a substrate structure for a composite semiconductor substrate which can be easily aligned and a method for manufacturing the same.

Another object of this invention is to provide an insulated gate bipolar transistor (IGBT) and a method for manufacturing the same.

The above objects can be attained by a semiconductor substrate structure which comprises a composite substrate (10) formed by bonding the main surface of a first semiconductor substrate (11) and the main surface of a second semiconductor substrate (12) together with an insulation film (13) interposed therebetween;

an etched portion (17) formed by selectively etching the insulation film (13) and the first semiconductor substrate (11) of the composite substrate (10) to reach at least the second semiconductor substrate (12);

an epitaxial layer (14) formed on the second semiconductor substrate (12) to fill the etched portion (17); and an impurity layer (15) formed between the first semiconductor substrate (11) and epitaxial layer (14) to extend to the surface of the composite substrate, the impurity layer (15) having an etching rate different from that of the first semiconductor substrate (11) and epitaxial layer (14) because of the impurity concentration thereof which is different from that of the first semiconductor substrate (11) and that of the epitaxial layer (14).

With this construction, the insulation film which is partly removed as a part of the etched portion is formed inside the composite substrate in parallel with the main surface thereof. The second semiconductor substrate is bonded to the first semiconductor substrate with the insulation film interposed therebetween, and the epitaxial layer which has been formed on the second semiconductor substrate by the epitaxial growth method is disposed in the etched portion. The impurity layer of high impurity concentration is formed between the first semiconductor substrate and the epitaxial layer.

The surfaces of the epitaxial layer and first semiconductor substrate of the composite substrate are mirror-polished for element formation. At this time, it is impossible to detect the location of the insulation film embedded in the substrate by simply observing the polished surface. However, when the polished surface is subjected to the silicon etching process, the impurity layer of high impurity concentration on the etched surface is etched at a higher or lower etching rate and therefore the location of the insulation film in the composite substrate can be easily determined based on the etching pattern of the impurity layer of high impurity concentration.

Further, with the substrate in which an element isolation region is formed from the etched surface to the insulation film, a function element or elements with a high withstanding voltage can be formed in the epitaxial layer and an element or elements with a low withstanding voltage can be formed in the first semiconductor substrate.

BRIEF DESCRIPTION OF THE DRAWINGS

FIGS. 4 and 5 are cross sectional views showing an example in which function elements are formed in the substrate of FIG. 2;

FIGS. 6A, 6B, 7A, 7B and 9 are cross sectional views of substrate structures according to other embodiments of this invention; and FIGS. 8A to 8D are cross sectional views showing an IGBT according to a still another embodiment of this invention and the manufacturing steps therefor.

DETAILED DESCRIPTION OF THE PREFERRED EMBODIMENTS

Figure 1:
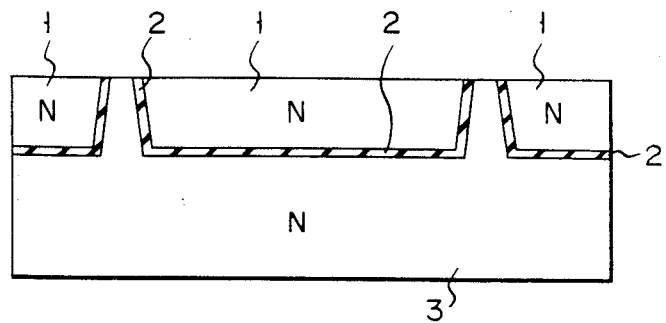
FIG. 1 is a cross sectional view showing an example of the conventional element isolation structure.

There will now be described a composite substrate according to an embodiment of this invention with reference to the accompanying drawings.

First, the concentration of composite substrate 20 according to one embodiment of this invention is explained with reference to FIG. 2.

The main surface of first semiconductor substrate 11 of N-type is bonded to the main surface of second semiconductor substrate 12 with the mirror surfaces thereof bonded to insulation film 13. Openings OP11 and OP13 which are positioned in alignment with each other are formed in first semiconductor substrate 11 and insulation film 13, respectively. Recess OP12 is formed in second semiconductor substrate 12 in alignment with opening OP13 of insulation film 13. N-type impurity layer 15 of high impurity concentration is formed in those portions of the surfaces of semiconductor substrates 11 and 12 which are exposed to openings OP11 and OP13. N-type epitaxial layer 14 of low impurity concentration is formed in openings OP11 and OP13 and recess OP12. The upper surfaces of first semiconductor substrate 11 and epitaxial layer 14 are, for example, mirror-polished with slurry and a polishing cloth, so as to be in flush with each other.

Impurity layer 15 is formed to have an impurity concentration higher than first semiconductor substrate 11 and epitaxial layer 14. Impurity layer (15) is formed between first semiconductor substrate 11 and epitaxial layer 14 and between said second semiconductor substrate 12 and epitaxial layer 14 to cover epitaxial layer 14.

Figure 2:
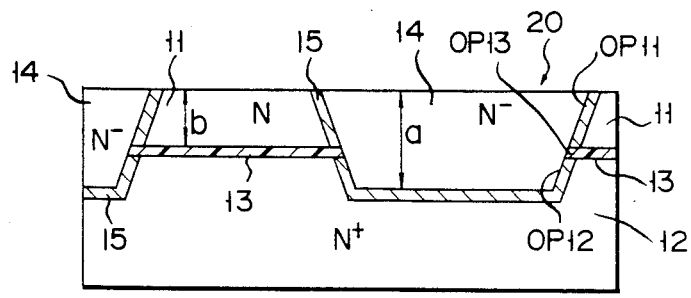
FIG. 2 is a cross sectional view showing the substrate structure according to one embodiment of this invention.

In composite substrate 20 of FIG. 2, it is impossible to determine the location of embedded oxide film 13 or epitaxial layer 14 by observing the polished surface with the naked eye or microscope. However, when the polished surface is etched by a silicon etching solution such as a mixture of HF, HNO$_3$, CH$_3$COOH and I$_2$, N$^+$-type impurity layer 15 is etched at a higher etching rate than first semiconductor substrate 11 and epitaxial region 14. As are result, the etching patterns of first semiconductor substrate 11, epitaxial region 14 and impurity layer 15 can be clearly observed. Therefore, the locations of embedded oxide film 13 and epitaxial region 14 can be easily determined by simply observing the etched surface. Therefore, the alignment process such as mask alignment effected in the succeeding process can be made simple.

Now, the method of forming the substrate structure shown in FIG. 2 is explained with reference to FIGS. 3A to 3I.

Figure 3A:
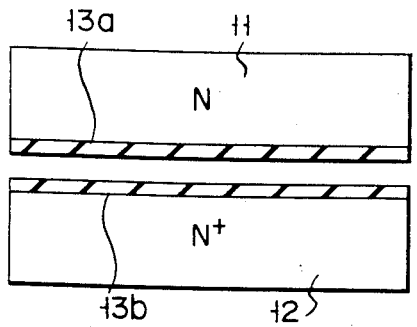
FIGS. 3A to 3K are cross sectional views showing the process of manufacturing the substrate structure in FIG. 2.
Figure 3B:
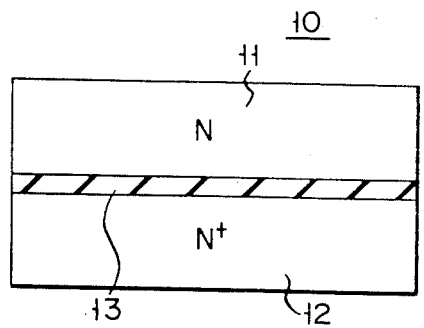
Figure 3C:
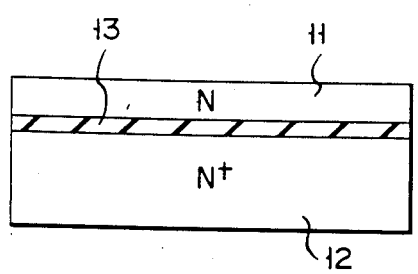
Figure 3D:
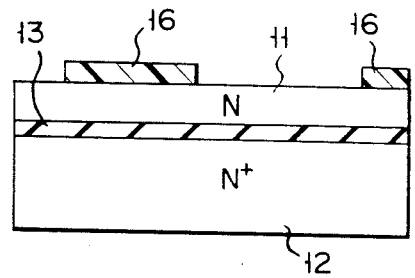
Figure 3E:
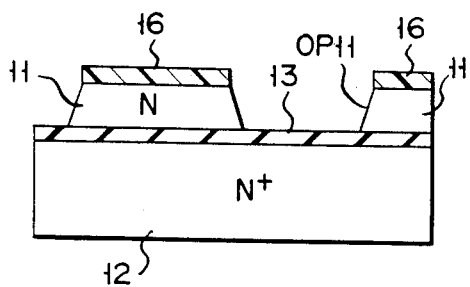
Figure 3F:
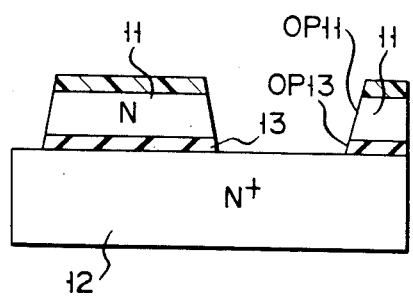

A bonding surface of first semiconductor substrate 11 (formed of an N-type silicon about 500 μm thick), and a bonding surface of second semiconductor substrate 12 (formed of an N$^+$-type silicon) are mirror-finished to provide a surface roughness of below 500 Å each. At this time, a decreasing step is performed with a step for removing an impurity-concentrating film on the surface of a silicon wafer, such as an oxide film, depending on the surface state of the silicon water. After being treated with clean wafer, about 1 μm-thick thermal oxidation films (insulation films) 13a, 13b are formed on the bonding surfaces of these substrates by, for example, thermal oxidation or CVD in a clean atmosphere of below Class 1 as shown in FIG. 3A. The surfaces of oxidation films 13a, 13b are mirror-finished if necessary. Then, the resultant surfaces of first and second semiconductor substrates 11 and 12 are attached to each other in an adequately clean atmosphere and this structure is then heat-treated at, for example, above 1000° C. to obtain composite substrate structure 10, with the mirror-finished surfaces bonded with oxide film 13 therebetween (See FIG. 3B). The surface of the first semiconductor substrate 11 in composite substrate structure 10 is polished to have a thickness of, for example, about 100 μm (See FIG. 3C) and oxide film 16 is selectively formed as an etching-resistant film on the surface of the resultant structure (See FIG. 3D). Then, first semiconductor substrate 11 is selectively etched (with oxide film 16 used as a mask) to expose portions of oxide film 13, as shown in FIG. 3E. Exposed portions of oxide film 13 are etched as shown in FIG. 3F. Then, second semiconductor substrate 12 is etched down to a predetermined depth to provide etched area 17 as shown in FIG. 3G.

Figure 3G:
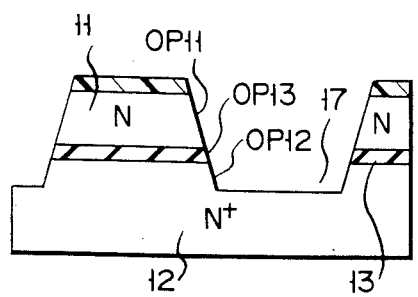
Figure 3H:
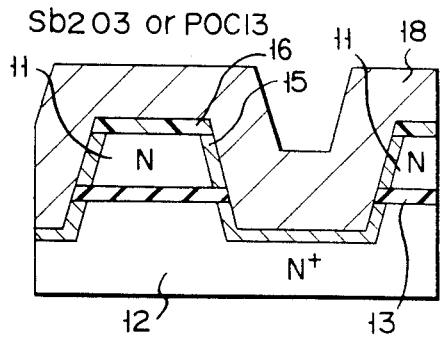

For example, Sb$_2$O$_3$ layer or POCl$_3$ layer 18 is deposited on the resultant semiconductor structure shown in FIG. 3G and then the heat treatment is effected. As a result, N-type impurity layer 15 of high impurity concentration is formed around etched portion 17 as shown in FIG. 3H. (It is also possible to form impurity layer 15 by, for example, an ion-implantation technique.) Then, deposition layer 18 and SiO$_2$ layer 16 are removed in this sequence.

Figure 3I:
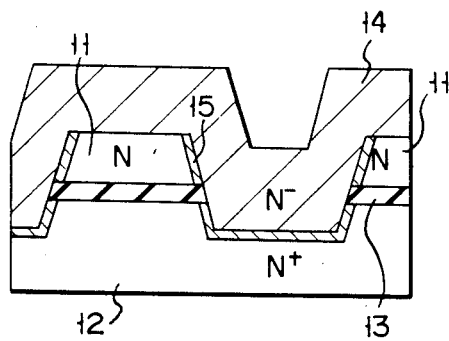

As shown in FIG. 3I, an N-type silicon is vapor-grown on the surface of the resultant structure of bury etched area 14. In this way, epitaxial layer 19 is formed monolithic with second semiconductor substrate 12. Then, the surface of the first semiconductor substrate portion is polished to leave a thickness of, for example, 20 μm.

In this way, substrate structure 20 for a composite semiconductor device, as shown in FIG. 2, according to this embodiment is completed.

Figure 3K:
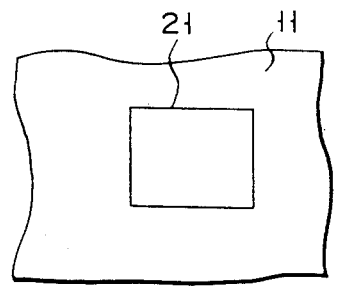
Figure 3J:
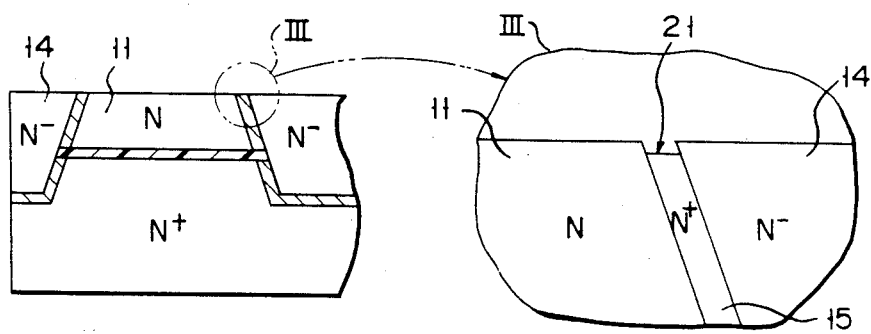
Figure 8D:
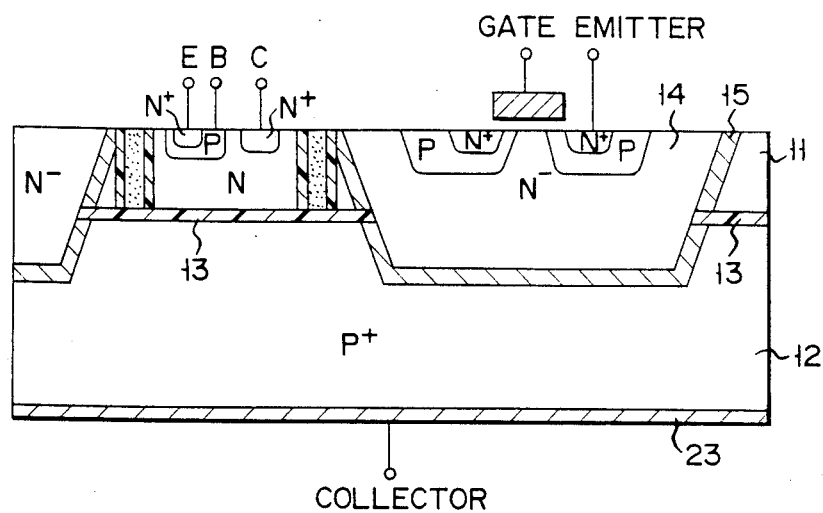

In the structure of FIG. 2, it is impossible to determine the location of embedded oxide film 13 or epitaxial layer 14 by observing the polished surface with the naked eye or microscope. Therefore, when elements (transistors, resistors, capacitors or the like) are formed in substrate 20, it is difficult to determine the location of element formation areas. In order that the location can be easily determined, the polished surface is etched by a silicon etching solution such as a mixture of HF, HNO$_3$, CH$_3$COOH and I$_2$. Then, N$^+$-type impurity layer 15 is etched at a higher etching rate than first semiconductor substrate 11 and epitaxial region 14. As a result, the etching pattern 21 of impurity layer 15 can be crearly observed as shown in FIG. 3K which is an enlarged view of circled portion III in FIG. 3J. Therefore, the locations of embedded oxide film 13 and epitaxial region 14 can be easily determined by simply observing the etched surface.

After the etching pattern is detected based on etching pattern 21 while the substrate surface is being observed by use of a microscope, a mask alignment process is effected and then elements are formed in a suitable portion of substrate 20. An example of substrate 20 in which elements are formed and a method for forming elements in substrate 20 are explained with reference to FIGS. 4 and 5.

FIG. 4 shows substrate 20 on which substrate surface etching pattern 21 is formed and which has been subjected to the element isolation process. As shown in FIG. 4, a plurality of grooves 51 of 4 to 5 μm width are formed by the RIE method to reach insulation film 13 from the substrate surface in first silicon substrate 11, for example, N-type silicon substrate 11 having thickness b of 20 μm. After thermal oxide film 51a is formed on the surface of grooves 51, polysilicon layer 51b is formed in grooves 51 to a thickness of 4 to 5 μm so as to attain a flat surface. The region surrounded by thermal oxide film 13 and groove 51 formed by the RIE method is electrically isolated from the remaining region to form island region 52.

FIG. 5 shows an example in which function elements are formed in substrate 20 of FIG. 4. Function elements which do not require high withstanding voltage are formed in island region 52. In FIG. 5, NPN transistor 63 having emitter 29, collector 27 and base 28 is formed in one of island regions 52 and P-channel MOSFET 62 having gate 26, drain 25 and source 24 is formed in another island region 52. Further, D-MOSFET 61 acting as a power element having base 30, source 31 and gate 32 is formed in epitaxial layer 14 by a known method. Layer 23 formed in second semiconductor substrate 12 is an N-type silicon layer of high impurity concentration or metal layer, for example, and serves as a current passage or an electrode. In FIG. 5, reference numeral 33 denotes an insulative protection film.

In FIG. 2, thickness a of epitaxial region 14 is larger than thickness b of N-type silicon layer 11. However, in a case where the power element formed in epitaxial region 14 has a low withstanding voltage and a large current capacity, it is preferable to set thickness b of first semiconductor substrate (N-type silicon) 11 and thickness a of epitaxial region 14 substantially equal to each other as shown in the embodiment of FIGS. 6A and 6B. In this case, thickness a and b are different from each other by the thickness of insulation film 13. The structure shown in FIG. 6A can be obtained by effecting the diffusion step shown in FIG. 3H after the step of FIG. 3E, effecting the step of FIG. 3F for removing insulation film 13, and forming epitaxial layer 14 by the epitaxial growth method without effecting the step of FIG. 3G. In FIG. 6A impurity layer 15 surrounds epitaxial layer 14. The structure of FIG. 6B can be obtained by effecting the step of FIG. 3H without effecting the step of FIG. 3G for etching second semiconductor substrate 12.

In the former embodiments, impurity layer 15 is formed to have a higher impurity concentration than the surrounding regions, but it is also possible to form impurity layer 15 so as to have a lower impurity concentration than the surrounding regions. The important thing is that impurity layer 15 is etched at an etching rate different from that of first semiconductor substrate 11 and epitaxial layer 14 when the surface of semiconductor substrate 11 is etched.

It is possible to form impurity layer 15 by using P-type impurity region as the modification of the structure shown in FIGS. 2 and 6. When impurity layer 15 is formed of P-type, epitaxial region 14 is isolated from semiconductor substrate 11 by a PN junction formed of P$^+$-type region 15 and the adjacent N-type region. Thus, it becomes unnecessary to form complicated trench isolation 51, and therefore an element isolation can be easily attained.

FIGS. 7A and 7B show another embodiment of this invention. In this embodiment, pattern 41 having the same plane configuration as etched portion 17 is formed on the back surface of substrate 12 instead of impurity layer 15. Pattern 41 is formed by an etching process, for example. As shown in FIG. 7B, in a case where elements are formed in epitaxial layer 14 or the like after the substrate surface is etched or polished, it is possible to form the elements in the surface area of the substrate while observing the location of embedded oxide film 13 based on the location of pattern 41. However, this method will be practically inconvenient in comparison with the case of FIG. 2.

In the former embodiments, the conductivity types of first semiconductor substrate 11 and second semiconductor substrate 12 are the same. However, this invention is not limited to this case. That is, two semiconductor substrates having different conductivity types can be bonded. Next, an embodiment in which two semiconductor substrates having different conductivity types can be bonded and an IGBT is formed in the substrate as explained with reference to FIGS. 8A to 8D.

In this embodiment, the conductivity type of second semiconductor substrate 12 is P$^+$-type. First semiconductor substrate 11 of N-type and second semiconductor substrate of P-type are subjected to the steps similar to those of FIGS. 3A to 3F so as to attain the semiconductor structure shown in FIG. 8A. Then, as shown in FIG. 8B, N$^+$-type epitaxial layer 15 with a thickness of approx. 15 μm is formed around etched portion 17 of semiconductor substrate 11. After this, layers 16 and 18 are removed, and N-type an epitaxial layer is formed on impurity layer 15. Then, the substrate surface is polished to make the surface flat. Next, as shown in FIG. 8C, isolation structure 51 is formed in first semiconductor substrate 11 to form island region 52. Further, an IGBT controlling PNP transistor is formed in island region 52, and an insulated gate and an emitter are formed in epitaxial layer 14 in a well known manner to complete the IGBT. Conductive layer 23 formed on second semiconductor substrate 12 of P$^+$-type serves as a collector electrode.

In the prior art, the IGBT is formed by forming an N$^+$-type epitaxial layer on a P$^+$-type substrate, and forming an N-type layer thereon by the epitaxial growth method. When the structure of this invention is used, the IGBT can be easily constituted by using the composite substrate.

Figure 9:
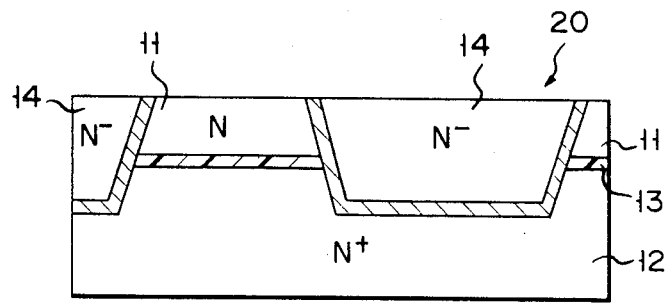

This invention is not limited to the above embodiments. For example, in the former embodiments, impurity layer 15 is formed by diffusing impurity into semiconductor substrates 11 and 12. However, it is possible to form impurity layer 15 by the epitaxial growth method as shown in FIG. 9.

Further, in the above embodiments, insulation films 13a and 13b are formed on first and second semiconductor substrates 11 and 12. However, it is possible to bond the first and second semiconductor substrates to each other after an insulation film is formed on one of the first and second semiconductor substrates.

What is claimed is:

1. A semiconductor substrate for a composite semiconductor device comprising:
    a composite substrate formed by bonding the main surface of a first semiconductor substrate and the main surface of a second semiconductor substrate together with an insulation film interposed therebetween;
    an etched portion formed by selectively etching said insulation film and said first semiconductor substrate of said composite substrate to reach at least said second semiconductor substrate;
    an epitaxial layer formed on said second semiconductor substrate to fill said etched portion, said epitaxial layer being electrically connected to said first and second semiconductor substrates; and
    an impurity layer formed between said first semiconductor substrate and epitaxial layer extending to the surface of said composite substrate, said impurity layer having an etching rate different from etching rates of said first semiconductor substrate and epitaxial layer.

2. A semiconductor substrate for a composite semiconductor device according to claim 1, wherein said impurity layer is formed of a surface area of said first semiconductor substrate, the area facing toward said epitaxial layer, and impurity being doped into said area.

3. A semiconductor substrate for a composite semiconductor device according to claim 2, wherein said first semiconductor substrate and said epitaxial layer are of a first conductivity type, said impurity layer is of a second conductivity type, and said first semiconductor substrate is electrically isolated from said epitaxial layer by means of said impurity layer.

4. A semiconductor substrate for a composite semiconductor device according to claim 1, wherein said impurity layer comprises areas of said first and second semiconductor substrates, said areas facing toward said epitaxial layer, and impurity being doped into said areas.

5. A semiconductor substrate for a composite semiconductor device according to claim 1, wherein said impurity layer comprises an area of said epitaxial layer, the area including impurity and facing said first and second semiconductor substrates.

6. A semiconductor substrate for a composite semiconductor device according to claim 1, wherein said composite semiconductor substrate has a pattern of said impurity layer which indicates a position of said epitaxial layer in said composite substrate and said pattern is formed on the surface of said composite substrate based on the difference in the etching rates of said first semiconductor substrate, said epitaxial layer and said impurity layer.

7. A semiconductor substrate for a composite semiconductor device according to claim 6, which further comprises a power element formed in said epitaxial layer and a semiconductor element formed in said first semiconductor substrate for controlling said power element, the power element and the semiconductor element being formed by using the impurity layer as a mark for mask alignment.

8. A composite semiconductor substrate according to claim 1, further comprising an emitter formed in said epitaxial layer, and a gate formed in said epitaxial layer being insulated from said epitaxial layer, wherein said first semiconductor substrate is of N-type, said second semiconductor substrate is of P-type, said epitaxial layer is of N-type, and said impurity layer is of N-type and has an impurity concentration higher than that of said first semiconductor substrate and said epitaxial layer, and wherein said second semiconductor substrate acts as a collector, thereby forming an IGBT.

* * * * *